United States Patent [19]
Niijima

[11] Patent Number: 5,732,047
[45] Date of Patent: Mar. 24, 1998

[54] TIMING COMPARATOR CIRCUIT FOR USE IN DEVICE TESTING APPARATUS

[75] Inventor: Hirokatsu Niijima, Gyoda, Japan

[73] Assignee: Advantest Corporation, Tokyo, Japan

[21] Appl. No.: 762,803

[22] Filed: Dec. 9, 1996

[30] Foreign Application Priority Data

Dec. 12, 1995 [JP] Japan ............................. 7-323321

[51] Int. Cl.⁶ ..................... G04B 47/00; G04F 8/00; G01R 31/28
[52] U.S. Cl. ............. 368/10; 368/113; 324/73.1; 371/21.1; 371/25.1
[58] Field of Search ............. 368/10, 113–120; 324/73.1, 158 R; 371/15.1, 21.1, 22.1–22.3, 25.1, 27

[56] References Cited

U.S. PATENT DOCUMENTS

| | | | |
|---|---|---|---|
| 4,070,565 | 1/1978 | Borrelli | 235/302 |
| 4,108,358 | 8/1978 | Niemaszyk | 235/302 |
| 4,994,732 | 2/1991 | Jeffrey et al. | 324/73.1 |
| 5,212,443 | 5/1993 | West et al. | 324/158 R |
| 5,311,486 | 5/1994 | Alton et al. | 368/10 |

*Primary Examiner*—Vit W. Miska
*Attorney, Agent, or Firm*—Staas & Halsey

[57] ABSTRACT

A timing comparator circuit for use in device testing apparatus is provided which can eliminate, in the window comparison mode, an off time during which a failure cannot be detected. There are provided first and second window strobe pulse generating circuits S/RFF1 and S/RFF2 for alternately generating window strobe pulses, first and second failure detecting circuits 5a and 5b for detecting whether a failure signal exists or not in the output signals from a level comparator 2 during the pulse duration of each window strobe pulse supplied thereto from the first and the second window strobe pulse generating circuits, and first and second interleave circuits.

7 Claims, 6 Drawing Sheets

TIMING COMPARATOR CIRCUIT FOR USE IN DEVICE TESTING APPARATUS

BACKGROUND OF THE INVENTION

1. Field of the Invention

The present invention relates to a timing comparator circuit which is suitable for use in device testing apparatus including a semiconductor memory testing apparatus for testing pass/failure of a semiconductor memory such as a RAM (random access memory), a ROM (read only memory), a charge coupled device (CCD) memory or the like, and a testing apparatus for testing pass/failure of other semiconductor devices, electronic components, etc.

For the purpose of facilitating understanding of the present invention, following discussion will be directed to a case in which the present invention is applied to a semiconductor memory testing apparatus for testing pass/failure of a semiconductor memory. However, it is needless to say that the present invention can similarly be applied to various device testing apparatus other than a semiconductor memory testing apparatus.

2. Description of Related Art

A semiconductor memory testing apparatus comprises mainly a timing generator (TG), a test pattern generator, a waveform shaping circuit, a logical comparator circuit and a failure (or fail) analysis memory. The test pattern generator generates, in response to a reference clock supplied from the timing generator, an address signal, a test data signal and a control signal which are to be applied to a semiconductor memory to be tested (commonly called a device under test (DUT)) as well as an expected value data signal to be applied to the logical comparator circuit and to the failure analysis memory. The address signal, the test data signal and the control signal excluding the expected value data signal are inputted to the waveform shaping circuit where the waveforms thereof are shaped to the waveforms required for testing the memory under test, and then these signals are applied to a memory to be tested.

A memory under test is controlled in writing or reading of test data thereinto or therefrom by an application of a control signal thereto. That is, when a control signal for writing is applied to the memory under test, test data is successively written into addresses of the memory under test, each address being specified by a corresponding address signal. When a control signal for reading is applied to the memory under test, written test data is successively read out from addresses of the memory under test, each being specified by an address signal. The data signals read out from the memory under test are supplied to the logical comparator circuit where each of the data signals is compared with an expected value data outputted from the test pattern generator. The logical comparator circuit outputs a disconformable data what is called failure (or fail) data when the comparison result is a discord. Usually, a logical "1" is outputted as a failure data. On the contrary, when the comparison result is an accord, the logical comparator outputs a conformable data, i.e., a pass data. Since a failure data is a logical "1", a logical "0" is outputted as a pass data. A failure data is sent to the failure analysis memory (not shown) and is stored therein. A pass data is not stored in the failure analysis memory.

Before a data signal read out from a memory under test is logically compared with an expected value data signal from the test pattern generator in the logical comparator circuit, the level (amplitude) of the data signal is first compared with an expected value level. When the data signal level is not within an allowable range, a logical "1" output (accordingly, a failure signal) is generated. When the data signal level is within the allowable range, a logical "0" output (accordingly, a pass signal) is generated. Thereafter, the failure signal or the pass signal is compared with a clock for timing comparison generated from the timing generator. Regarding the timing comparison, there are two modes. One of the two modes is an edge comparison mode in which an edge strobe pulse is used and a failure signal or a pass signal is compared with the edge strobe pulse at only one point in time thereof. The other mode is a window comparison mode in which a window strobe pulse is used and a failure signal or a pass signal is compared with the window strobe pulse during the pulse duration (pulse width). The present invention relates to an improvement in a timing comparator circuit operating in the window comparison mode by which a glitch can be eliminated.

Now, an example of a conventional timing comparing section wherein an edge comparison mode or a window comparison mode can be used by selecting one of them will be explained with reference to a block diagram thereof shown in FIG. 4 and timing charts shown in FIGS. 5 and 6 for explaining the operation of the timing comparing section when operates in the window comparison mode.

The timing comparing section shown in FIG. 4 comprises first and second timing comparators CMP1 and CMP2, a mode switch SW for performing a switch of the timing mode to the edge comparison mode or to the window comparison mode, a timing comparator circuit 5 which operates in the window comparison mode and including a window strobe pulse generating circuit, and a multiplexer (MUX) 1 for selecting and outputting one of two outputs, one from the second timing comparator CMP2 and the other from the timing comparator circuit 5. This timing comparing section can operate in the edge comparison mode when a movable contact "c" of the mode switch SW is connected to a fixed contact "a" to which a logical "0" output is applied and can operate in the window comparison mode when the movable contact "c" is connected to a fixed contact "b" to which a logical "1" output is applied. The example shown in FIG. 4 shows a state in which the timing comparing section operates in the window comparison mode since the movable contact "c" of the mode switch SW is connected to the fixed contact "b".

In each of a series of periods constituting one test cycle, an output signal read out from a device under test, i.e., a memory under test 1 (hereinafter, referred to as DUT) in this example, is sent first to a level comparator 2 where the signal level is compared with an expected value level. There are two expected value levels. One of the two levels is a comparison voltage VOH which is used when an output from the DUT 1 is a logical "1" and the other level is a comparison voltage VOL which is used when an output from the DUT 1 is a logical "0". In either case of VOH and VOL, a logical "0" is outputted from the level comparator 2 when the comparison result is "pass" and a logical "1" is outputted from the level comparator 2 when the comparison result is "failure". The output of the level comparator 2 is sent to the first and second timing comparators CMP1 and CMP2 in the timing comparing section and also to an AND gate AND1 of the timing comparator circuit 5 in the timing comparing section.

In this example, a timing generator (TG) 6 provides to the first timing comparator CMP1 a first strobe pulse STRB1 (see FIG. 5B) having a pulse width of ¼ of one period (T) which functions as a clock for timing comparison and is compared in timing with a failure signal (logical "1" output)

or a pass signal (logical "0" output) outputted from the level comparator 2. As is apparent from FIG. 5, the pulse width of the first strobe pulse STRB1 is wider than the pulse width of a logical "1" output (a failure signal, see FIG. 5A) of the level comparator 2. The timing generator 6 provides to the second timing comparator CMP2 a second strobe pulse STRB2 (see FIG. 5C) which is delayed by ½ of one period from the first strobe pulse STRB1 and having the same pulse width as that of the first strobe pulse STRB1 and is similarly compared in timing with a failure signal or a pass signal outputted from the level comparator 2. Each of these timing comparators CMP1 and CMP2 outputs a logical "0" when the comparison result is "pass" and outputs a logical "1" when the comparison result is "failure". Further, the first strobe pulse STRB1 is also supplied to a clock terminal of a first flip-flop FF1 through a first delay circuit 3 and the second strobe pulse STRB2 is also supplied to a clock terminal of a second flip-flop FF2 through a second delay circuit 4.

When the edge comparison mode is selected, a logical "0" (L level) output is applied to a set terminal S of a multiplexer MUX1 and to a clear terminal CL of the first flip-flop FF1. As a result, the multiplexer MUX1 is set such that its input A is connected to its output Q and the first flip-flop FF1 is in the operation state since it is not cleared. Therefore, the comparison result of the first timing comparator CMP1 is stored in the first flip-flop FF1 by application of the first strobe pulse STRB1 delayed by the first delay circuit 3 to the clock terminal of the first flip-flop FF1. Similarly, the comparison result of the second timing comparator CMP2 is stored in the second flip-flop FF2 via the multiplexer MUX1 by application of the second strobe pulse STRB2 (STRB2' in the example shown in FIG. 4) delayed by the second delay circuit 4 to the clock terminal of the second flip-flop FF2.

Failure data Df1 and Df2 stored in the first and second flip-flops FF1 and FF2, respectively, are sent to a logical comparator circuit 7 where each of these failure data is compared with an expected value signal supplied from the test pattern generator not shown.

On the other hand, when the window comparison mode is selected, a logical "1" (H level) output is supplied to the set terminal S of the multiplexer MUX1 and to the clear terminal CL of the first flip-flop FF1. In this case, the multiplexer MUX1 is set such that its input B is connected to its output Q. The first flip-flop FF1 remains cleared, and thus, even if the comparison result of the first timing comparator CMP1 is supplied to the D terminal of the first flip-flop FF1, the Q output remains in logical "0" state. Therefore, only output of the timing comparator circuit 5 which operates in the window comparison mode is in the state that the output can be stored in the second flip-flop FF2 via the multiplexer MUX1.

The timing comparator circuit 5 is constructed, in the illustrated example, by the aforementioned AND gate AND1, a set/reset flip-flop S/R•FF1 which functions as a window strobe pulse generating circuit, and a third flip-flop FF3.

The set/reset flip-flop S/R•FF1 has its set terminal S supplied with the first strobe pulse STRB1 from the timing generator 6, its reset terminal R supplied with the second strobe pulse STRB2 from the timing generator 6, and its Q output connected to the other input of the AND gate AND1 and to the clock terminal of the third flip-flop FF3. Since a logical "1" output is always applied to the data terminal D of the third flip-flop FF3, when the set/reset flip-flop S/R•FF1 is set by application of the first strobe pulse STRB1 to its set terminal S and a logical "1" is outputted from its Q output, the Q output of the third flip-flop FF3 becomes a logical "1". Consequently, a logical "0" of an XQ output of the third flip-flop FF3 which is an inverted output of the Q output is supplied to the B input of the multiplexer MUX1.

The AND gate AND1 is enabled when a logical "1" is outputted from the Q output of the set/reset flip-flop S/R•FF1. Thus, when a logical "1", i.e., a failure signal (FIG. 5A) is outputted from the level comparator 2 and is supplied to the AND gate AND1, this failure signal passes through the AND gate AND1 to the clear terminal CL of the third flip-flop FF3. Consequently, the third flip-flop FF3 is cleared and its XQ output becomes a logical "1", and hence, a logical "1" is supplied to the B input of the multiplexer MUX1. The XQ output of the third flip-flop FF3 remains in logical "1" (failure) state (see FIG. 5K) until the set/reset flip-flop S/R•FF1 is set by a leading edge of the first strobe pulse STRB1 in the next period.

In such a manner, the AND gate AND1 is enabled during a time duration from when the set/reset flip-flop S/R•FF1 is set by the first strobe pulse STRB1 to when the set/reset flip-flop S/R•FF1 is reset by the second strobe pulse STRB2. During the AND gate AND1 is enabled, if a failure signal (a logical "1" output) is supplied to the AND gate AND1, the failure signal is passed therethrough. In other words, the set/reset flip-flop S/R•FF1 serves as a window strobe pulse generating circuit which generates a window strobe pulse W•STRB shown in FIG. 5I rising up at a leading edge of the first strobe pulse STRB1 and falls down at a leading edge of the second strobe pulse STRB2. During the pulse duration of this window strobe pulse (time period of logical "1"), the AND gate AND1 is open (ON) and hence, if a logical "1" output is supplied thereto from the level comparator 2, the logical "1" output is passed therethrough (see FIG. 5J). Therefore, when a failure occurs, a logical "1" output (FIG. 5K) is supplied from the XQ output of the third flip-flop FF3 to the data terminal D of the second flip-flop FF2 via the multiplexer MUX1 until the set/reset flip-flop S/•FF1 is set by a leading edge of a first strobe pulse STRB1 in the next period.

Thus, in the window comparison mode, only the window comparison result supplied to the B input of the multiplexer MUX1 from the inverted output XQ of the third flip-flop FF3 is stored in the second flip-flop FF2.

As mentioned above, in the window comparison mode, since a logical "1" (H level) signal is supplied to the mode switch SW as shown in FIG. 5A0, a logical "1" output remains applied to the clear terminal CL of the first flip-flop FF1 and to the set terminal S of the multiplexer MUX1 so that the Q output of the first flip-flop FF1 is a logical "0" (L level) as shown in FIG. 5L.

As shown in FIG. 5, if a failure signal "1" (FIG. 5 A) is generated from the level comparator 2, for instance, at the time point when the first strobe pulse STRB1 ends, this failure signal passes through the AND gate AND1 and is inputted to the clear terminal CL of the third flip-flop FF3. Accordingly, a failure signal shown in FIG. 5J is outputted from the AND gate AND1 and the third flip-flop FF3 is cleared by the leading edge of the this failure signal, and then a failure signal shown in FIG. 5K is inputted to the B input of the multiplexer MUX1 from the XQ output of the third flip-flop FF3. Therefore, from the Q output of the multiplexer MUX1 is outputted the same failure signal as that of the B input (see FIG. 5F), which is supplied to the data terminal D of the second flip-flop FF2.

As mentioned above, since a strobe pulse STRB2' (see FIG. 5H) which is one delayed from the second strobe pulse STRB2 by a predetermined time interval (in this example, the pulse duration of the second strobe pulse STRB2) by the second delay circuit 4 is supplied to the clock terminal of the second flip-flop FF2, a failure signal (FIG. 5F) of the data terminal D of the second flip-flop FF2 begins to be stored in the second flip-flop FF2 from a time point when the strobe pulse STRB2' is applied to the clock terminal of the second flip-flop FF2. Since the Q output of the second flip-flop FF2 remains logical "1" until the strobe pulse STPB2' of the next period is applied to the clock terminal, a failure signal shown in FIG. 5M is supplied to the logical comparator circuit 7.

In such a way, in the window comparison mode, the comparison of timing is performed during the time duration between the first strobe pulse STRB1 and the second strobe pulse STRB2 which are the clocks for the timing comparison, respectively, generated from the timing generator 6. In other words, the timing comparison is performed during the pulse duration of the window strobe pulse W•STRB (FIG. 5I) generated from the set/reset flip-flop S/R•FF1. However, as shown in FIG. 5K, it is during the time duration from the time point when the pulse STRB2' delayed by the second delay circuit 4 is applied to the clock terminal of the second flip-flop FF2 to the time point when the set/reset flip-flop S/R•FF1 is set by the first strobe pulse STRB1 in the next period of the test cycle (accordingly, until the leading edge of the window strobe pulse W•STRB in the next period is inputted to the third flip-flop FF3) that the detected failure signal is actually stored in the second flip-flop FF2. Therefore, a hatched portion of the waveform in FIG. 5K forms a failure settled data (using a different expression, a time period that can be used for storing the failure signal of the third flip-flop FF3 in the second flip-flop FF2).

A time interval τ from the time point when a window strobe pulse W•STRB in one period ends to the time point when a window strobe pulse W•STRB in the next period rises is called an "off time" during which any timing comparison cannot be performed with respect to a failure signal or pass signal. Therefore; a failure which occurs during this off time cannot be detected.

In order to reduce the duration of the off time, it is necessary to extend the range (or width of the region) of the window comparison. For the purpose of extending the range of the window comparison, if the time point of generation of the second strobe pulse STRB2 is delayed so as to approach the first strobe pulse STRB1 in the next period as indicated by an arrow in FIG. 6, the region (a hatched area in FIG. 6K) of the failure settled data becomes narrower. Thus, the minimum set-up/hold time required to store a failure data from the third flip-flop FF3 in the second flip-flop FF2 is not satisfied (the region of the failure settled data becomes shorter than the minimum set-up/hold time) and hence, there occurs a situation that a failure data cannot be stored. Therefore, this minimum set-up/hold time is the time interval that can never be eliminated.

The minimum set-up/hold time is called a minimum off time $\tau_{min}$, and by the aforementioned reason the second strobe pulse STRB2 and the first strobe pulse STRB1 in the next period cannot be set within this minimum off time. That is, a time interval equal to or longer than the minimum off time $\tau_{min}$ must be provided between the second strobe pulse STRB2 and the first strobe pulse STRB1 in the next period. In order to make it possible to detect a failure occurring during this minimum off time, in the prior art DUTs are tested twice by shifting the timing of generating the first and second strobe pulses in the second test cycle by a time interval equal to or longer than the minimum off time from that in the first test cycle. Therefore, there is a shortcoming that twice as long as the testing time is required and the efficiency of the testing is very poor.

SUMMARY OF THE INVENTION

It is an object of the present invention to provide a timing comparator circuit for use in a device testing apparatus which can eliminate, in the window comparison mode, an off time during which a failure cannot be detected, and can perform the timing comparison for all the data outputted from a device under test by only one testing.

In accordance with the present invention, there is provided a timing comparator circuit which comprises first and second window strobe pulse generating circuits for alternately generating window strobe pulses, first and second failure detecting circuits for detecting whether a failure signal exists or not in the output signals from a level comparator during the pulse duration of each window strobe pulse supplied thereto from the first and the second window strobe pulse generating circuits, and first and second interleave circuits. The timing comparator circuit is arranged such that first strobe pulses are interleaved into two pulse trains, one generated in odd periods and the other generated in even periods, by the first interleave circuit thereby to operate the first window strobe pulse generating circuit by the one first strobe pulse train in the odd periods and to operate the second window strobe pulse generating circuit by the other first strobe pulse train in the even periods, and second strobe pulses are interleaved into two pulse trains, one generated in odd periods and the other generated in even periods, by the second interleave circuit thereby to stop the operation of the first window strobe pulse generating circuit by the one second strobe pulse train in the odd periods and to stop the operation of the second window strobe pulse generating circuit by the other second strobe pulse train in the even periods, whereby a window strobe pulse for odd period and a window strobe pulse for even period are generated from the first and second window strobe pulse generating circuits, respectively, and whether a failure occurs or not in data (signals) outputted from the level comparator is detected during the pulse duration of each of the window strobe pulse for odd period and the window strobe pulse for even period.

According to the timing comparator circuit thus constructed, even if the time point of generation of the second strobe pulse is brought into close to the time point of generation of the first strobe pulse in the next period or even if the time point of generation of the second strobe pulse is brought into the same time point as that of the first strobe pulse in the next period, it is possible that the outputs of the first and second failure detecting circuits are not cleared by the leading edge of the window strobe pulse in the immediately next period but is cleared by the leading edge of the window strobe pulse in the period after the immediately next period. Thus, the width of the failure settled data region can be extended. Accordingly, a failure settled data region longer than the minimum set-up/hold time (the minimum off time) required for storing one of the outputs of the first and second failure detecting circuits in storage means can be secured and the minimum off time between an odd period and an even period during which a timing comparison cannot be performed can be made zero. Consequently, a failure occurring at any point in time can be detected by one test cycle, and hence, the testing time can be significantly reduced and the testing apparatus can be used very efficiently.

DETAILED DESCRIPTION OF THE PREFERRED EMBODIMENTS

Figure 2:
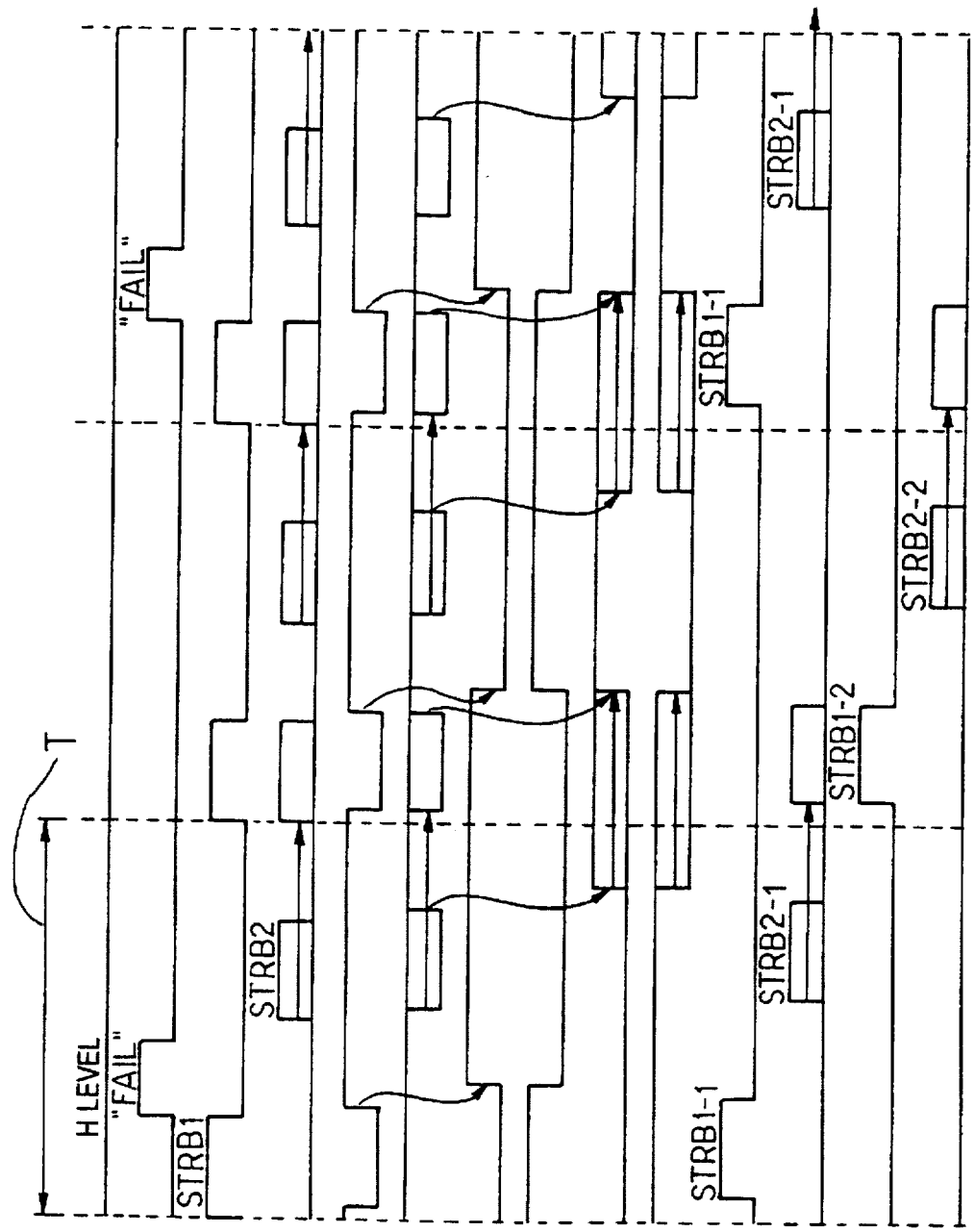
FIG. 2 is a time chart showing waveforms at various points in the circuit of FIG. 1.
Figure 3:
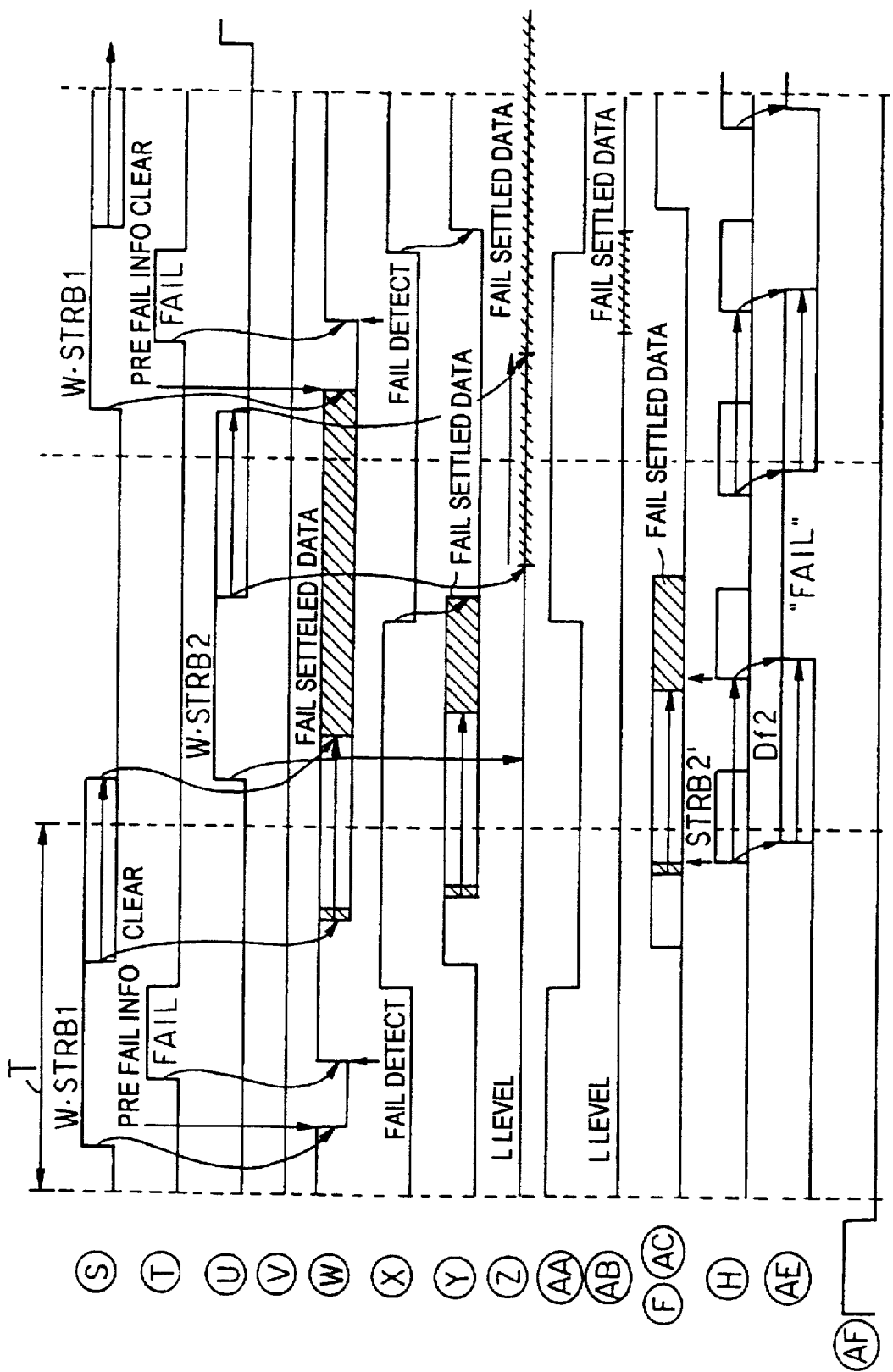
FIG. 3 is a time chart showing waveforms at other various points in the circuit of FIG. 1.

Now, the preferred embodiments of the present invention will be described in detail with reference to FIGS. 1 through 3. Further, in FIG. 1, the same reference characters are assigned to the portions or components corresponding to those in FIG. 4 and the explanation of those portions will be omitted unless it is necessary.

Figure 1:
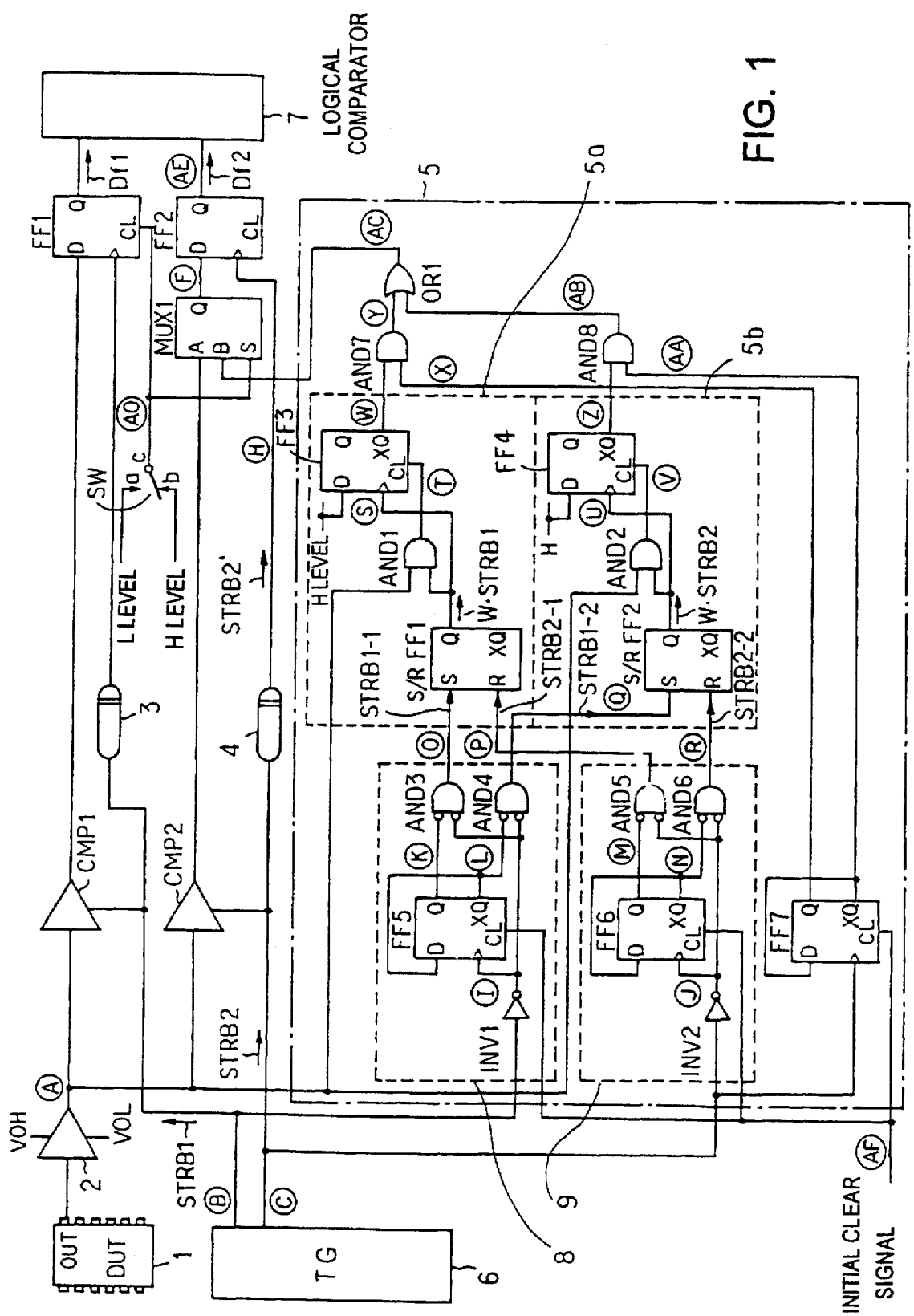
FIG. 1 is a block diagram showing a circuit construction of a principal portion of a semiconductor memory testing apparatus in which a timing comparator circuit according to the present invention is used.

FIG. 1 shows an embodiment of a timing comparator circuit according to the present invention which operates in the window comparison mode and the illustrated embodiment is a case in which it is applied to a semiconductor memory testing apparatus. Like the prior art timing comparing section shown in FIG. 4, the timing comparing section shown in FIG. 1 is also arranged such that it operates in the edge comparison mode when the movable contact "c" of the mode switch SW is connected to the fixed contact "a" to which a logical "0" output is applied and operates in the window comparison mode when the movable contact "c" is connected to the fixed contact "b" to which a logical "1" output is applied. As mentioned above, since the present invention relates to a timing comparator circuit which operates in the window comparison mode, the operation of the timing comparator circuit in the window comparison mode will be mainly described hereafter.

In each of a series of periods constituting one test cycle, an output signal read out from a DUT 1 is sent first to a level comparator 2 where the signal level is compared with an expected value level. There are two expected value levels. One of the two levels is a comparison voltage VOH which is used when an output from the DUT 1 is a logical "1" and the other level is a comparison voltage VOL which is used when an output from the DUT 1 is a logical "0". In either case of VOH and VOL, a logical "0" is outputted from the level comparator 2 when the comparison result is "pass" and a logical "1" is outputted from the level comparator 2 when the comparison result is "failure". The output of the level comparator 2 is sent to the first and second timing comparators CMP1 and CMP2 of the timing comparing section and also to a first and a second AND gates AND1 and AND2 of the timing comparator circuit 5 according to the present invention in the timing comparing section, which operates in the window comparison mode.

A timing generator (TG) 6 provides to the first timing comparator CMP1 a first strobe pulse STRB1 (see FIG. 2B) having a pulse width of ¼ of one period (T) which functions as a clock for timing comparison and is compared in timing with a failure signal (logical "1" output) or a pass signal (logical "0" output) outputted from the level comparator 2. The timing generator 6 provides to the second timing comparator CMP2 a second strobe pulse STRB2 (see FIG. 2C) which is delayed by ½ of one period from the first strobe pulse STRB1 and having the same pulse width as that of the first strobe pulse STRB1 and is similarly compared in timing with a failure signal or a pass signal outputted from the level comparator 2. Each of these timing comparators CMP1 and CMP2 outputs a logical "0" when the comparison result is "pass" and outputs a logical "1" when the comparison result is "failure".

When the edge comparison mode is selected, a logical "0" (L level) output is applied to a set terminal S of a multiplexer MUX1 and to a clear terminal CL of the first flip-flop FF1. As a result, the multiplexer MUX1 is set such that its input A is connected to its output Q and the first flip-flop FF1 is in the operation state since it is not cleared. Therefore, the comparison result of the first timing comparator CMP1 is stored in the first flip-flop FF1 by application of the pulse STRB1 delayed by a predetermined time interval by a first delay circuit 3 to the clock terminal of the first flip-flop FF1, and the comparison result of the second timing comparator CMP2 is stored in the second flip-flop FF2 via the multiplexer MUX1 by application of the pulse STRB2' delayed by a predetermined time interval from the second strobe pulse STRB2 by a second delay circuit 4 to the clock terminal of the second flip-flop FF2.

On the other hand, when the window comparison mode is selected, a logical "1" (H level) output is supplied to the set terminal S of the multiplexer MUX1 and to the clear terminal CL of the first flip-flop FF1. In this case, the multiplexer MUX1 is set such that its input B is connected to its output Q. The first flip-flop FF1 remains cleared, and thus, even if the comparison result of the first timing comparator CMP1 is supplied to the D terminal of the first flip-flop FF1, the Q output remains in logical "0" state. Therefore, only output of the timing comparator circuit 5 which operates in the window comparison mode is in the state that the output can be stored in the second flip-flop FF2 via the multiplexer MUX1.

In this embodiment, the timing comparator circuit 5 comprises first and second failure detecting circuits 5a and 5b having the same circuit construction and each including a window strobe pulse generating circuit, a first interleave circuit 8 for interleaving (alternately distributing) the first strobe pulse STRB1 generated in each of a series of periods constituting one test cycle into two strobe pulse trains, one generated in odd periods and the other generated in even periods, thereby to supply the one first strobe pulse train generated in odd periods to the first failure detecting circuit 5a and the other first strobe pulse train generated in even periods to the second failure detecting circuit 5b, a second interleave circuit 9 for interleaving the second strobe pulse STRB2 generated in each of a series of periods into two strobe pulse trains, one generated in odd periods and the other generated in even periods, thereby to supply the one second strobe pulse train generated in odd periods to the first failure detecting circuit 5a and the other second strobe pulse train generated in even periods to the second failure detecting circuit 5b, the second interleave circuit 9 having the same circuit construction as that of the first interleave circuit 8, and an output switching circuit comprising seventh and eighth AND gates AND7 and AND8, an OR gate OR1 and a seventh flip-flop FF7 and for controlling to alternately switch over the outputs of the first and second failure detecting circuits 5a and 5b from one to another.

Figure 4:
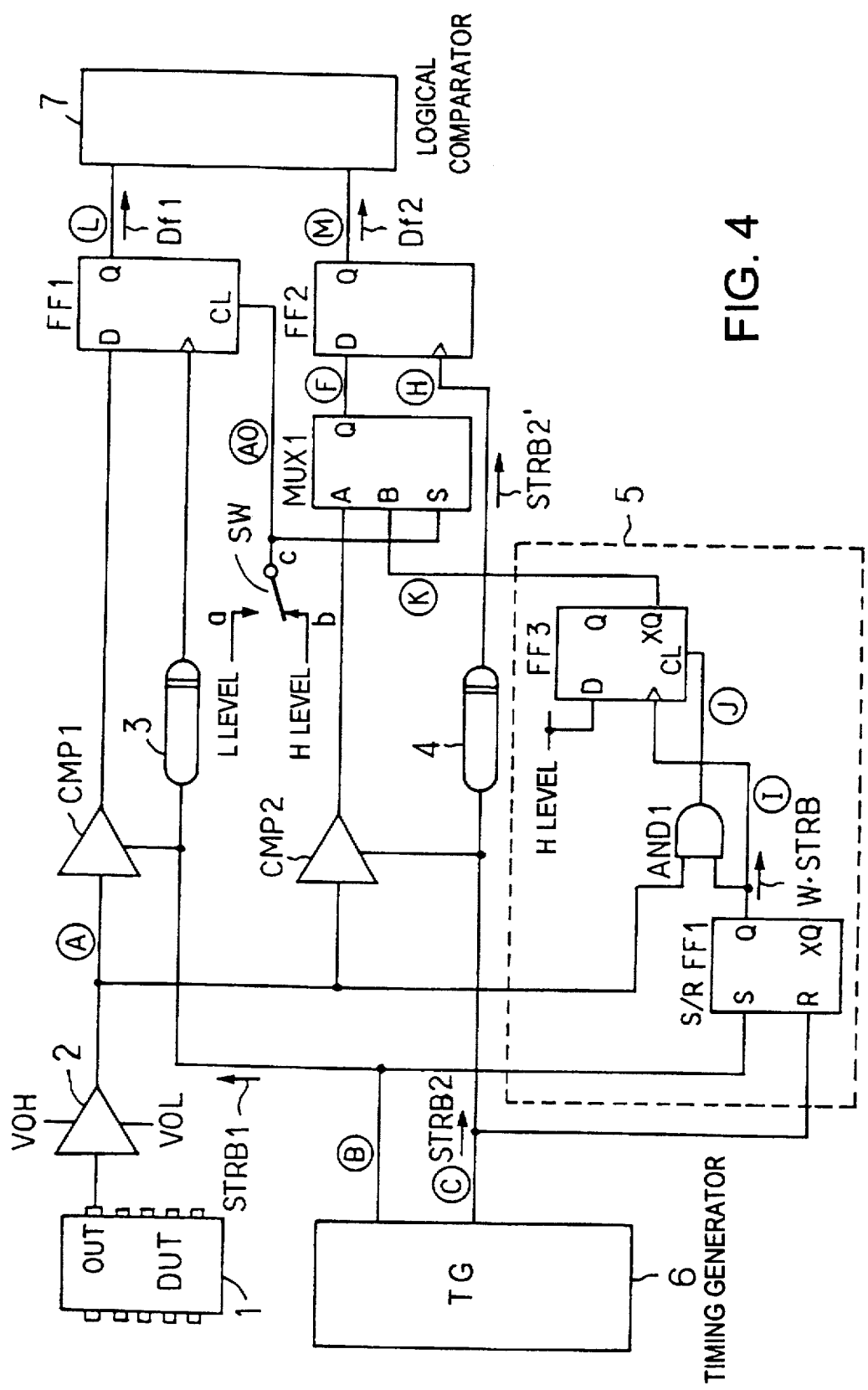
FIG. 4 is a block diagram of a portion of the circuit including a timing comparator circuit of a conventional semiconductor memory testing apparatus.
Figure 5:
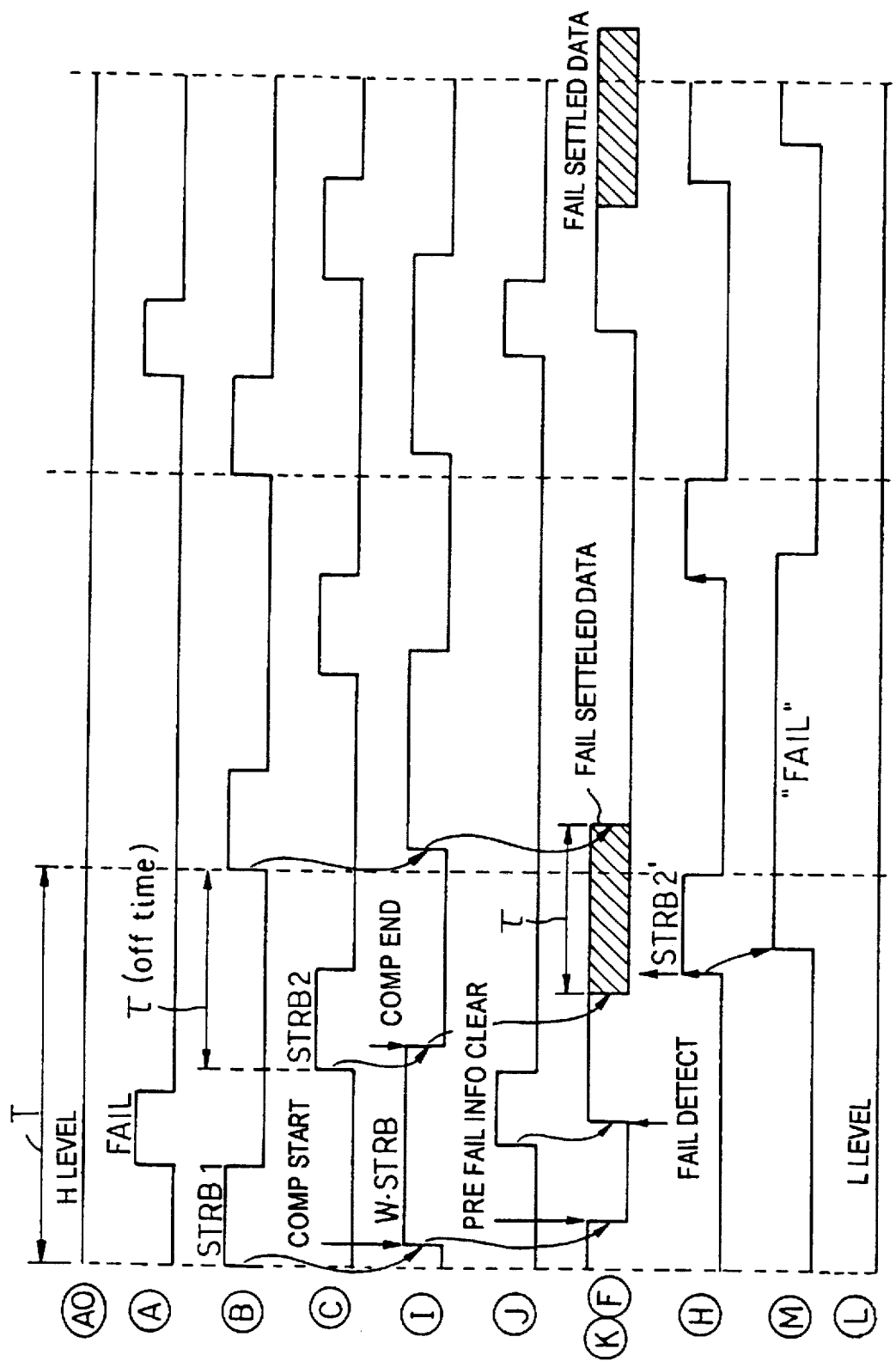
FIG. 5 is a time chart showing waveforms at various points in the circuit of FIG. 4.
Figure 6:
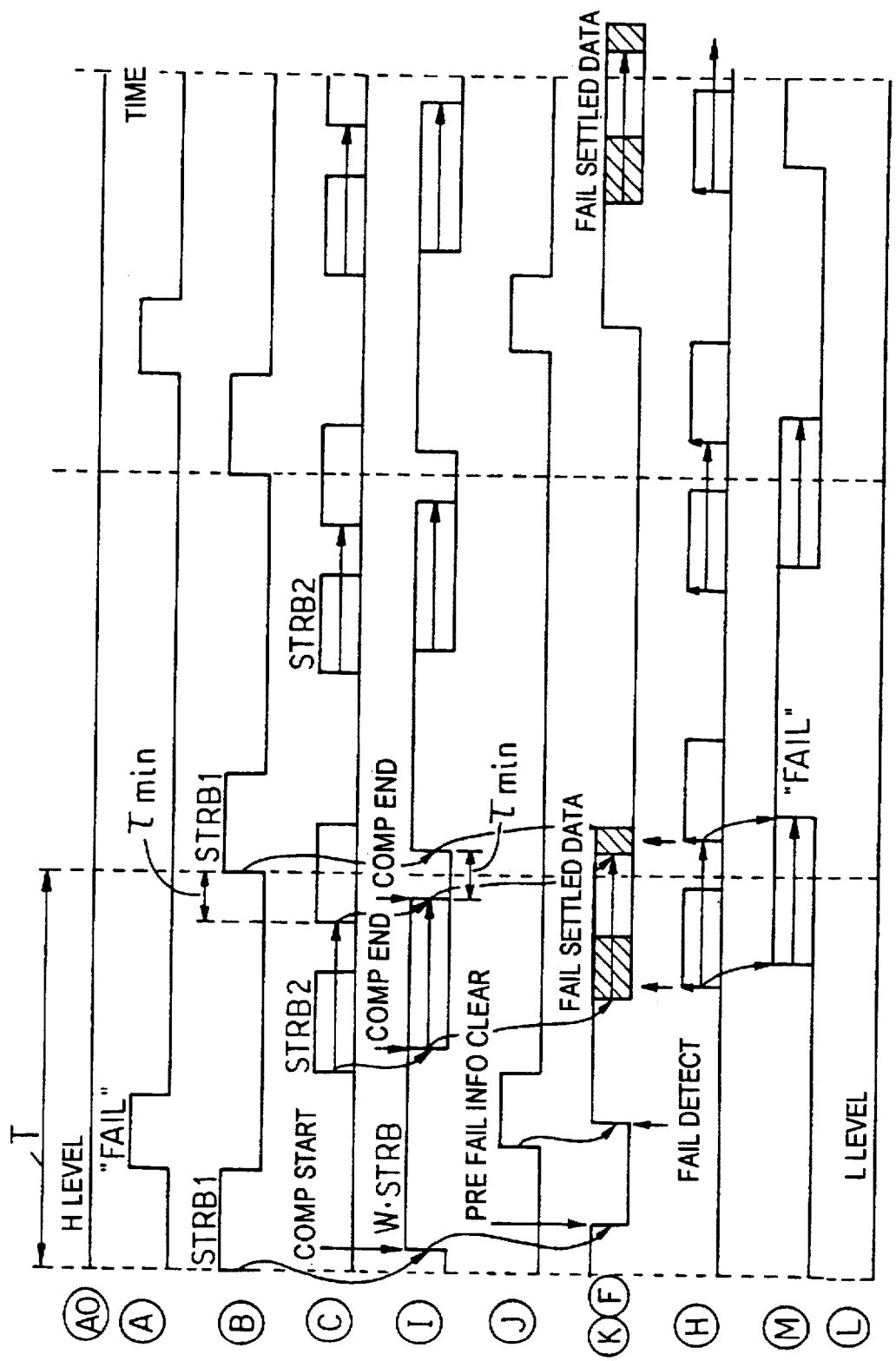
FIG. 6 is a time chart similar to FIG. 5 when the off time is reduced in the circuit of FIG. 4.

Since each of the first and second failure detecting circuits 5a and 5b has the same circuit construction as that of the prior art timing comparator circuit 5 shown in FIG. 4, and operates in the same manner, the explanation thereof will be omitted. However, the output of the first failure detecting circuit 5a, i.e., the inverted output XQ of the third flip-flop FF3 in this example, is connected to one input of the seventh AND gate AND7, and the output of the second failure detecting circuit 5b, i.e., the inverted output XQ of the fourth flip-flop FF4 in this example, is connected to one input of the eighth AND gate AND8. The outputs of these AND gates AND7 and AND8 are connected to the B input of the multiplexer MUX1 via the OR gate OR1.

The first interleave circuit 8 comprises a fifth flip-flop FF5, a third AND gate AND3 whose one input is connected to the Q output of the fifth flip-flop FF5, a fourth AND gate AND4 whose one input is connected to the XQ output of the fifth flip-flop FF5, and a first invertor INV1 for inverting the first strobe pulse STRB1 to supply the inverted first strobe pulse STRB1 to the clock terminal of the fifth flip-flop FF5 and to each of the other inputs of the third and fourth AND gates AND3 and AND4. The output of the third AND gate AND3 is connected to the set terminal S of the set/reset flip-flop S/R•FF1 which operates as a window strobe pulse generating circuit, of the first failure detecting circuit 5a and the output of the fourth AND gate AND4 is connected to the set terminal S of the set/reset flip-flop S/R•FF2 which operates as a window strobe pulse generating circuit, of the second failure detecting circuit 5b.

The second interleave circuit 9 comprises a sixth flip-flop FF6, a fifth AND gate AND5 whose one input is connected to the Q output of the sixth flip-flop FF6, a sixth AND gate AND6 whose one input is connected to the XQ output of the sixth flip-flop FF6, and a second invertor INV2 for inverting the second strobe pulse STRB2 to supply the inverted second strobe pulse STRB2 to the clock terminal of the sixth flip-flop FF6 and to each of the other inputs of the fifth and sixth AND gates AND5 and AND6. The output of the fifth AND gate AND5 is connected to the reset terminal R of the set/reset flip-flop S/R•FF1 of the first failure detecting circuit 5a and the output of the sixth AND gate AND6 is connected to the reset terminal R of the set/reset flip-flop S/R•FF2 of the second failure detecting circuit 5b.

Here, since each input terminal of the third through sixth AND gates AND3–AND6 is an inverted terminal, a logical "1" is outputted from each of these AND gates only when a logical "0" is inputted to each of the two inputs of each AND gate. Otherwise, a logical "0" is outputted.

In this manner, since each of the first and second interleave circuits 8 and 9 has the same circuit construction, the operation of the first interleave circuit 8 will be now explained in detail.

First, in the initial state, since the fifth flip-flop FF5 is in the cleared state by an initial clear signal shown in FIG. 3AF, its Q output is a logical "0" and its XQ output is a logical "1". Also, since an output of the first invertor INV1 is a logical "1", each output of the third and fourth AND gates AND3 and AND4 is logical "0". Therefore, both the set/reset flip-flops S/R•FF1 and S/R•FF2 of the first and second failure detecting circuits 5a and 5b are in the reset state.

In this state, when a test cycle is started and the first strobe pulse STRB1 shown in FIG. 2B is supplied to the input of the first invertor INV1 of the first interleave circuit 8 in the first odd period, a logical "0" which is an inverted waveform of the first strobe pulse STRB1 is outputted from the invertor INV1 as shown in FIG. 2I. Consequently, since a logical "0" is supplied to the clock terminal of the fifth flip-flop FF5, its Q output remains a logical "0" and its XQ output remains a logical "1". However, the third AND gate AND3 being enabled by the logical "0" of the Q output of the fifth flip-flop FF5 opens the gate (turns on) and outputs a logical "1" because a logical "0" of the invertor INV1 is supplied to the other input thereof. Accordingly, the set/reset flip-flop S/R•FF1 of the first failure detecting circuit 5a is set and a logical "1" is outputted from the Q output.

When the first strobe pulse STRB1 of the first odd period ends, the input of the first invertor INV1 becomes a logical "0". Thus, its output becomes a logical "1" and this logical "1" is supplied to the clock terminal of the fifth flip-flop FF5 and to the third and fourth AND gates AND3 and AND4. By this, a logical "1" of the data terminal D of the flip-flop FF5 is supplied to the Q output and the XQ output becomes a logical "0". Therefore, the third AND gate AND3 turns off and the fourth AND gate AND4 is now enabled.

When the first strobe pulse STRB1 of the next period (the first even period) is supplied to the input of the first invertor circuit INV1, the output of the first invertor circuit INV1 becomes a logical "0". Therefore, the fourth AND gate AND4 being enabled at the end of the first strobe pulse STRB1 of the previous period (the first odd period) now turns on and outputs a logical "1". By this, the set/reset flip-flop S/R•FF2 of the second failure detecting circuit 5b is set and a logical "1" is outputted from the Q output thereof.

When the first strobe pulse STRB1 of the first even period ends, the input of the first invertor INV1 becomes a logical "0". Thus, its output becomes a logical "1" and this logical "1" is supplied to the clock terminal of the fifth flip-flop FF5 and to the third and fourth AND gates AND3 and AND4. By this, a logical "0" of the data terminal D of the flip-flop FF5 is supplied to the Q output and the XQ output becomes a logical "1". Therefore, the fourth AND gate AND4 turns off and the third AND gate AND3 is now enabled again. The output waveform of the first invertor INV1 is shown in FIG. 2I, the waveform of the Q output of the fifth flip-flop FF5 is shown in FIG. 2K, and the waveform of the XQ output is shown in FIG. 2L.

Thereafter, the first interleave circuit 8 repeats the above-mentioned operations.

As can be easily understood from the above explanation of the operations, the output of the third AND gate AND3 becomes as shown in FIG. 2O and the output of the fourth AND gate AND4 becomes as shown in FIG. 2Q. Thus, it is seen that the first strobe pulse STRB1 of each period is interleaved into a STRB1-1 and a STRB1-2. In this example, the first strobe pulse STRB1 generated in each odd period in the test cycle is interleaved as a STRB1-1, and the first strobe pulse STRB1 generated in each even period is interleaved as a STRB1-2.

The second interleave circuit 9 also operates like the first interleave circuit 8. Since it is apparent that the second strobe pulse STRB2 of each period supplied to the input of the second invertor INV2 is interleaved to a STRB2-1 and a STRB2-2, the explanation of the operation of the second interleave circuit 9 will be omitted by showing the output waveform of the invertor INV2 in FIG. 2J, the waveform of the Q output of the sixth flip-flop FF6 in FIG. 2M, the waveform of the XQ output of the sixth flip-flop FF6 in FIG. 2N, the output waveform of the fifth AND gate AND5 in FIG. 2P and the output waveform of the sixth AND gate AND6 in FIG. 2R.

In such a way, by interleaving the first and second strobe pulses STRB1 and STRB2 in each period using the first and second interleave circuits 8 and 9, supplying the strobe pulses STRB1-1 and STRB2-1 in the odd periods of both strobe pulses STRB1 and STRB2 to the first failure detecting circuit 5a, and supplying the strobe pulses STRB1-2 and STRB2-2 in the even periods of both strobe pulses STRB1 and STRB2 to the second failure detecting circuit 5b, the first and second failure detecting circuits 5a and 5b operate as follows.

In the first failure detecting circuit 5a, since a logical "1" output is always applied to the data terminal D of the third flip-flop FF3, when the set/reset flip-flop S/R•FF1 is set by application of the strobe pulse STRB1-1 in an odd period of the first strobe pulse STRB1 thereto and a logical "1" is outputted from the Q output of the set/reset flip-flop S/R•FF1, the Q output of the third flip-flop FF3 becomes a logical "1".

When a logical "1" is outputted from the Q output of the set/reset flip-flop S/R•FF1, the first AND gate AND1 is enabled. Consequently, when a logical "1", i.e., a failure signal (FIG. 2A) is outputted from the level comparator 2 and is supplied to the first AND gate AND1, this failure signal passes through the AND gate AND1 to the clear terminal CL of the third flip-flop FF3. Therefore, the third flip-flop FF3 is cleared and the XQ output thereof becomes a logical "1". The XQ output of the third flip-flop FF3 remains in logical "1" (failure) state (see FIG. 3W) until the set/reset flip-flop S/R•FF1 is set by the leading edge of the first strobe pulse STRB1-1 in the next odd period since the interleaved first strobe pulse STRB1-2 is not supplied to the first failure detecting circuit 5a in an even period.

In such a way, the first AND gate AND1 is enabled after the set/reset flip-flop S/R•FF1 is set by the first strobe pulse STRB1-1 in an odd period until the set/reset flip-flop S/R•FF1 is reset by the second strobe pulse STRB2-1 in the same odd period. During this time interval, a failure signal (a logical "1" output) from the level comparator 2 passes through the AND gate AND1. Therefore, the set/reset flip-flop S/R•FF1 generates a window strobe pulse W•STRB1 shown in FIG. 3S which rises at the leading edge of the first strobe pulse STRB1-1 in an odd period and falls at the leading edge of the second strobe pulse STRB2-1 in the same odd period. During the pulse duration of this strobe pulse, the first AND gate AND1 is open and thus a logical "1" output (a failure signal) from the level comparator 2 passes through the AND gate AND1 (see FIG. 3T). Consequently, when a failure occurs, a logical "1" output (FIG. 3W) is supplied to one input of the seventh AND gate AND7 from the XQ output of the third flip-flop FF3. The logical "1" output from the XQ output of the third flip-flop FF3 is maintained until the set/reset flip-flop S/R•FF1 is set by the leading edge of the first strobe pulse STRB1-1 in the next odd period since the first strobe pulse STRB1-1 for setting the set/reset flip-flop S/R•FF1 does not exist in the next even period. That is, the region (a hatched region in FIG. 3) ranging from the leading edge of the second strobe pulse STRB2-1 in an odd period to the leading edge of the first strobe pulse STRB1-1 in the next odd period within the time duration during which a logical "1" is outputted from the XQ output of the third flip-flop FF3, is the failure settled data.

Also in the second failure detecting circuit 5b, a logical "1" output is always applied to the D terminal of the fourth flip-flop FF4. Therefore, when the set/reset flip-flop S/R•FF2 is set by the supply of a strobe pulse STRB1-2 in an even period of the first strobe pulse STRB1 and a logical "1" is outputted from the Q output, the Q output of the fourth flip-flop FF4 becomes a logical "1".

When a logical "1" is outputted from the Q output of the set/reset flip-flop S/R•FF2, the second AND gate AND2 is enabled. Therefore, when a logical "1", i.e., a failure signal, is outputted from the level comparator 2 and is supplied to the second AND gate AND2, this failure signal passes through the AND gate AND2 to the clear terminal CL of the fourth flip-flop FF4. Therefore, the fourth flip-flop FF4 is cleared and the XQ output thereof becomes a logical "1". The XQ output of the fourth flip-flop FF4 remains in logical "1" (failure) state (see FIG. 3Z) until the set/reset flip-flop S/R•FF2 is set by the leading edge of the first strobe pulse STRB1-2 in the next even period since the interleaved first strobe pulse STRB1-1 is not supplied to the second failure detecting circuit 5b in an odd period. However, since, in this example, no failure occurs in an even period, the waveform of the XQ output of the fourth flip-flop FF4 remains in logical "0" as shown in FIG. 3Z.

In such a way, the second AND gate AND2 is enabled after the set/reset flip-flop S/R•FF2 is set by the first strobe pulse STRB1-2 in an even period until the set/reset flip-flop S/R•FF2 is reset by the second strobe pulse STRB2-2 in the same even period. During this time interval, a failure signal (a logical "1" output) from the level comparator 2 passes through the AND gate AND2. Therefore, the set/reset flip-flop S/R•FF2 generates a window strobe pulse W-STRB2 shown in FIG. 3U which rises at the leading edge of the first strobe pulse STRB1-2 in an even period and falls at the leading edge of the second strobe pulse STRB2-2 in the same even period. During the pulse duration of this strobe pulse, the second AND gate AND2 is open and thus a logical "1" output (a failure signal) from the level comparator 2 passes through the AND gate AND2 (see FIG. 3V; however, in this example, since no failure occurs in an even period, the output of the second AND gate AND2 remains in logical "0"). Consequently, when a failure occurs, a logical "1" output is supplied to one input of the eighth AND gate AND8 from the XQ output of the fourth flip-flop FF4 until the set/reset flip-flop S/R•FF2 is set by the leading edge of the first strobe pulse STRB1-2 in the next even period.

Here, in the XQ output of the fourth flip-flop FF4 shown in FIG. 3Z, the hatched region is the failure settled data within the time duration of the logical "1" outputted when a failure signal arrives. This duration of the failure settled data is a range from the leading edge of the second strobe pulse STRB2-2 in an even period to the leading edge of the first strobe pulse STRB1-2 in the next even period.

The seventh and eighth AND gates AND7 and AND8 are controlled by the Q output and the XQ output of the seventh flip-flop FF7, respectively, with respect to their on/off. The seventh flip-flop FF7 has its data terminal D coupled to the XQ output and its clock terminal supplied with the second strobe pulse STRB2 from the timing generator 6. In the initial state, since the seventh flip-flop FF7 is cleared by the initial clear signal shown in FIG. 3AF, the Q output is a logical "0" and the XQ output is a logical "1". Consequently, in the initial state, the seventh AND gate AND7 is off and the eighth AND gate AND8 is enabled.

These AND gates AND7 and AND8 remain in the initial state until the test cycle is started and the second strobe pulse STRB2 is generated. When the second strobe pulse STRB2 is generated, a logical "1" of the data terminal D of the seventh flip-flop FF7 is supplied to its Q output. As a result, the Q output becomes a logical "1" and the XQ output becomes a logical "0". Thus, the seventh AND gate AND7 is enabled and the eighth AND gate AND8 turns off. This state continues until the second strobe pulse STRB2 is generated in the next period.

Since a logical "0" of the data terminal D of the seventh flip-flop FF7 is supplied to its Q output by the generation of the next second strobe pulse STRB2, the Q output becomes a logical "0" and the XQ output becomes a logical "1". As a result, the seventh AND gate AND7 turns off and the eighth AND gate AND8 is enabled. This state continues until the second strobe pulse STRB2 is generated in the next period.

As can be easily understood from the above description, the seventh AND gate AND7 turns on at the mid point of the first odd period (in this example, after a time interval corresponding to ½ of the period has passed) and turns off at the mid point of the first even period (in this example, after a time interval corresponding to ½ of the period has passed). On the other hand, the eighth AND gate AND8 turns on at the mid point of the first even period (in this example, after a time interval corresponding to ½ of the period has passed) and turns off at the mid point of the second odd period (in this example, after a time interval corresponding to ½ of the period has passed). The same operation is repeated in the following as shown in FIG. 3X and FIG. 3AA. Therefore, the seventh and eighth AND gates AND7 and AND8 alternately turn on and alternately supply the XQ output of the third flip-flop FF3 and the XQ output of the fourth flip-flop FF4 to the B input of the multiplexer MUX1 via the OR gate OR1. As a result, the timing comparison results are supplied to the B input of the multiplexer MUX1 in order of first odd period→first even period→second odd period→second even period→... Thus, the periods of the timing comparison results are restored to those of the original test cycle.

When a window comparison is performed by the timing comparator circuit constructed as described above, each failure settled data is not cleared by the leading edge of the window strobe pulse in the next period (is cleared by the leading edge of the window strobe pulse in the period after the next period). Therefore, the failure settled data region (hatched region in FIG. 3) can be extended significantly. As a result, in order to extend the window comparison range, even if the time point of generation of the second strobe pulse STRB2 is delayed, as indicated by an arrow in FIG. 2, so that it can approach the time point of generation of the first strobe pulse in the next period, or even if the time point of generation of the second strobe pulse is brought into the same time point as that of the first strobe pulse in the next period as shown in FIG. 2, that is, even if the minimum off time $\tau_{min}$ is made zero to perform continuous timing comparisons, since the failure settled data region has been extended to a portion in the period after the next period as mentioned above, the failure settled data region is merely reduced and does not become shorter than the minimum set-up/hold time required for storing the failure data from the third flip-flop FF3 or the fourth flip-flop FF3 in the second flip-flop FF2. As a result, the failure data can be stored completely.

Thus, according to the present invention, since the minimum off time can be eliminated, a failure that occurs at any time point can be detected. Therefore, since it is not necessary that, as in the prior art, DUTs are tested twice by shifting the timing of generating the first and second strobe pulses in the second test cycle by a time interval equal to or longer than the minimum off time from that in the first test cycle. Therefore, the testing time can be significantly reduced and the testing apparatus can be used very efficiently.

In the aforementioned embodiment, a case in which the present invention is applied to a semiconductor memory testing apparatus has been described. However, it is needless to say that the present invention can also be applied to an apparatus for testing a semiconductor device other than a memory or a device other than a semiconductor device such as an electronic component, and similar functional effects can be obtained. In addition, in the above-mentioned embodiment, since a window strobe pulse generating circuit is built in each of the first and second failure detecting circuits 5a and 5b, a window strobe pulse generating circuit may be provided independently of a failure detecting circuit. Moreover, the first and the second failure detecting circuits 5a and 5b have the same circuit construction and also the first and the second interleave circuits 8 and 9 have the same circuit construction, but it is unnecessary that the first failure detecting circuit 5a has the same circuit construction as that of the second failure detecting circuit 5b, and similarly, it is unnecessary that the first interleave circuit 8 has the same circuit construction as that of the second interleave circuits 9. In case that the first and the second failure detecting circuits 5a and 5b have the same circuit construction and/or the first and the second interleave circuits 8 and 9 have the same circuit construction as in the above embodiment, there are advantages that manufacture of a timing comparator circuit can be easy and hence, the work or operation efficiency can be improved and a timing comparator circuit can be manufactured at low cost, and further, a timing comparator circuit having good characteristics and high accuracy can be obtained.

As is apparent from the above description, in the present invention, the timing comparator circuit comprises the first and second window strobe pulse generating circuits for alternately generating window strobe pulses, the first and second failure detecting circuits for detecting whether a failure signal exists or not in the output signals from the level comparator during the pulse duration of each window strobe pulse supplied thereto from the first and the second window strobe pulse generating circuits, and the first and second interleave circuits, and is arranged such that the first strobe pulses are interleaved into two pulse trains, one generated in odd periods and the other generated in even periods, by the first interleave circuit thereby to operate the first window strobe pulse generating circuit by the one first strobe pulse train in the odd periods and to operate the second window strobe pulse generating circuit by the other first strobe pulse train in the even periods, and the second strobe pulses are interleaved into two pulse trains, one generated in odd periods and the other generated in even periods, by the second interleave circuit thereby to stop the operation of the first window strobe pulse generating circuit by the one second strobe pulse train in the odd periods and to stop the operation of the second window strobe pulse generating circuit by the other second strobe pulse train in the even periods, whereby a window strobe pulse for odd period and a window strobe pulse for even period are generated from the first and second window pulse generating circuits, respectively, and whether a failure occurs or not in data (signals) outputted from the level comparator is detected during the pulse duration of each of the window strobe pulse for odd period and the window strobe pulse for even period. As a result, even if the time point of generation of the second strobe pulse is brought into close to the time point of generation of the first strobe pulse in the next period or even if the time point of generation of the second strobe pulse is brought into the same time point as that of the first strobe pulse in the next period, it is possible that the outputs of the first and second failure detecting circuits are not cleared by the leading edge of the window strobe pulse in the immediately next period but is cleared by the leading edge of the window strobe pulse in the period after the immediately next period. Thus, the width of the failure settled data region can be extended. Accordingly, a failure settled data region longer than the minimum set-up/hold time (the minimum off time) required for storing one of the outputs of the first and second failure detecting circuits in storage means can be secured and the minimum off time between an odd period and an even period during which a timing comparison cannot be performed can be made zero. Consequently, there are advantages that a failure occurring at any point in time can be detected by one test cycle, and hence, the testing time can be significantly reduced and the testing apparatus can be used very efficiently.

What is claimed is:

1. A timing comparator circuit for use in a device testing apparatus, said device testing apparatus comprising:

level comparator means for comparing the level of an output signal read out of a device under test with a high or low reference level;

a timing generator for outputting strobe pulses serving as clock pulses for timing comparison;

a timing comparator circuit including window strobe pulse generating means and failure detecting means, said window strobe pulse generating means being operated by a first strobe pulse which rises at the start of each period and being stopped from operating by a second strobe pulse which rises in each period after a predetermined time interval has passed from the time point that said first strobe pulse has risen thereby generating a window strobe pulse for each period, said first and second strobe pulses being generated from said timing generator, said failure detecting means detecting whether there exists a failure signal or not in the signal of comparison result supplied from said level comparator means during the pulse duration of the window strobe pulse outputted from said window strobe pulse generating means; and storage means for storing therein a failure signal outputted from said timing comparator circuit, said timing comparator circuit comprising:

first window strobe pulse generating means for generating window strobe pulses;

first failure detecting means supplied with the signal of comparison result from said level comparator means for detecting whether a failure signal exists or not in said signal of comparison result during the pulse duration of the window strobe pulse supplied thereto from said first window strobe pulse generating means, and holding, when a failure signal is detected, the result of detection until the time point that the leading edge of the next window strobe pulse is generated from said first window strobe pulse generating means;

second window strobe pulse generating means for generating window strobe pulses;

second failure detecting means supplied with the signal of comparison result from said level comparator means for detecting whether a failure signal exists or not in said signal of comparison result during the pulse duration of the window strobe pulse supplied thereto from said second window strobe pulse generating means, and holding, when a failure signal is detected, the result of detection until the time point that the leading edge of the next window strobe pulse is generated from said second window strobe pulse generating means;

first interleave circuit for interleaving a first strobe pulse generated from said timing generator in each of a series of periods constituting one test cycle into two pulse trains, one generated in odd periods and the other generated in even periods, thereby to operate said first window strobe pulse generating means by supplying the one first strobe pulse train in the odd periods thereto and to operate said second window strobe pulse generating means by supplying the other first strobe pulse train in the even periods thereto; and second interleave circuit for interleaving a second strobe pulse generated from said timing generator in each of said series of periods into two pulse trains, one generated in odd periods and the other generated in even periods, thereby to stop the operation of said first window strobe pulse generating means by supplying the one second strobe pulse train in the odd periods thereto and to stop the operation of said second window strobe pulse generating means by supplying the other second strobe pulse train in the even periods thereto, whereby said first window strobe pulse generating means and said second window strobe pulse generating means are alternately operated by said first interleave circuit and said second interleave circuit thereby eliminating a time interval between a window strobe pulse generated by said first window strobe pulse generating means and a window strobe pulse generated by said second window strobe pulse generating means.

2. The timing comparator circuit according to claim 1, further including output switching means for alternately switching over the outputs of said first and second failure detecting means from one to another to supply the selected output to said storage means.

3. The timing comparator circuit according to claim 2, wherein said output switching means comprises: two AND gates; an OR gate outputting an ORed signal of outputs of said two AND gates; and a flip-flop for alternately switching over the outputs of said two AND gates from one to another to supply the selected one output to said OR gate, and wherein one of said AND gates has its one input connected to the output of said first failure detecting means and its the other input connected to the non-inverted output of said flip-flop, the other AND gate has its one input connected to the output of said second failure detecting means and its the other input connected to the inverted output of said flip-flop, and the output of said OR gate is supplied to said storage means.

4. The timing comparator circuit according to claim 1, wherein said first failure detecting means has the same circuit construction as that of said second failure detecting means, each of said first and second failure detecting means comprising an AND gate and a flip-flop, and wherein said AND gate has its one input supplied with the signal of comparison result from said level comparator means and its the other input supplied with a window strobe pulse from the corresponding window strobe pulse generating means, its output being supplied to the clear terminal of said flip-flop, and said flip-flop has its clock terminal supplied with a window strobe pulse from the corresponding window strobe pulse generating means, a failure signal being outputted from the inverted output of said flip-flop when the failure signal is detected.

5. The timing comparator circuit according to claim 1, wherein each of said first and said second window strobe pulse generating means comprises a set/reset flip-flop;

the set/reset flip-flop of said first window strobe pulse generating means is set by a first strobe pulse in each odd period supplied from said first interleave means and is reset by a second strobe pulse in each odd period supplied from said second interleave means, thereby to generate said window strobe pulse; and the set/reset flip-flop of said second window strobe pulse generating means is set by a first strobe pulse in each even period supplied from said first interleave means and is reset by a second strobe pulse in each even period supplied from said second interleave means, thereby to generate said window strobe pulse.

6. The timing comparator circuit according to claim 1, wherein said first interleave circuit has the same circuit construction as that of said second interleave circuit, each of said first and second interleave circuits comprising an inverter, a flip-flop having its clock terminal supplied with the output signal from said inverter and first and second AND gates each of which has its one input supplied with the inverted version of the output from said inverter, and wherein the non-inverted output of said flip-flop is supplied, after inverted, to the other input of said first AND gate, and the inverted output of said flip-flop is supplied to its data terminal and supplied, after inverted, to the other input of said second AND gate.

7. The timing comparator circuit according to claim 6, wherein a first strobe pulse is supplied to the input of the inverter of said first interleave circuit, the output of said first AND gate is supplied to the set terminal of the set/reset flip-flop of said first window strobe pulse generating means, and the output of said second AND gate is supplied to the set terminal of the set/reset flip-flop of said second window strobe pulse generating means; and a second strobe pulse is supplied to the input of the inverter of said second interleave circuit, the output of said first AND gate is supplied to the reset terminal of the set/reset flip-flop of said first window strobe pulse generating means, and the output of said second AND gate is supplied to the reset terminal of the set/reset flip-flop of said second window strobe pulse generating means.

\* \* \* \* \*